(12) United States Patent
Sundar et al.

(10) Patent No.: US 10,483,927 B2
(45) Date of Patent: Nov. 19, 2019

(54) AMPLIFIER ERROR CURRENT BASED ON MULTIPLE INTEGRATORS

(71) Applicant: TEXAS INSTRUMENTS INCORPORATED, Dallas, TX (US)

(72) Inventors: Aditya Sundar, Mumbai (IN); Jasjot Singh Chadha, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/856,050

(22) Filed: Dec. 27, 2017

(65) Prior Publication Data

US 2018/0337644 A1    Nov. 22, 2018

(30) Foreign Application Priority Data

May 16, 2017  (IN) .............................. 201741017080

(51) Int. Cl.
*H03F 3/217* (2006.01)
*H03F 3/183* (2006.01)
(Continued)

(52) U.S. Cl.
CPC ........... *H03F 3/2173* (2013.01); *H03F 1/083* (2013.01); *H03F 1/34* (2013.01); *H03F 3/183* (2013.01); *H03F 3/187* (2013.01); *H03F 3/45071* (2013.01); *H03F 3/45475* (2013.01); *H03F 2200/03* (2013.01); *H03F 2200/171* (2013.01); *H03F 2200/264* (2013.01); *H03F 2200/78* (2013.01); *H03F 2203/45264* (2013.01); *H03F 2203/45512* (2013.01); *H03F 2203/45526* (2013.01); *H03F 2203/45528* (2013.01); *H03F 2203/45594* (2013.01)

(58) Field of Classification Search
CPC .... H03F 3/2173; H03F 1/083; H03F 3/45475; H03F 3/187; H03F 1/34; H03F 3/45071; H03F 3/183; H03F 2203/45264; H03F 2200/264; H03F 2203/45528; H03F 2203/45526; H03F 2203/45512; H03F 2203/45594; H03F 2200/78; H03F 2200/03; H03F 2200/171; H03F 3/217; H03F 3/2171; H03F 2200/351
USPC ........................................ 330/10, 207 A, 251
See application file for complete search history.

(56) References Cited

U.S. PATENT DOCUMENTS 8,866,544 B2 * 10/2014 Llewellyn ............... H03F 3/217
330/10
2007/0194855 A1 * 8/2007 Miteregger ........ H03F 3/45183
330/302

(Continued)

*Primary Examiner* — Khanh V Nguyen
(74) *Attorney, Agent, or Firm* — John R. Pessetto; Charles A. Brill; Frank D. Cimino

(57) ABSTRACT

In some examples, an amplifier comprises a first integrator to receive a differential input signal, a second integrator coupled to the first integrator, a third integrator coupled to the second integrator, and a comparator to receive outputs of the second and third integrators, to compare each of the outputs to a reference signal that is below a power supply rail voltage supplied to the amplifier, and to produce an error current based on the comparison. The amplifier also comprises a feedback connection between the comparator and inputs to the second integrator. The feedback connection injects the inputs to the second integrator with a current that is determined at least in part by the error current.

20 Claims, 3 Drawing Sheets

(51) Int. Cl.
*H03F 3/45* (2006.01)
*H03F 1/08* (2006.01)
*H03F 1/34* (2006.01)
*H03F 3/187* (2006.01)

(56) References Cited

U.S. PATENT DOCUMENTS

| | | | |
|---|---|---|---|
| 2007/0296491 A1* | 12/2007 | Mazda | H03F 1/26 330/103 |
| 2013/0033319 A1* | 2/2013 | Chen | H03F 1/32 330/251 |
| 2013/0057331 A1* | 3/2013 | Yuan | H04R 3/04 327/341 |
| 2013/0223652 A1* | 8/2013 | Sahandiesfanjani | H03F 1/30 381/121 |

* cited by examiner

US 10,483,927 B2

AMPLIFIER ERROR CURRENT BASED ON MULTIPLE INTEGRATORS

CROSS-REFERENCE TO RELATED APPLICATIONS

The present application claims priority to Indian Provisional Patent Application No. 201741017080, which was filed May 16, 2017, is titled "A New Clamping Scheme For Higher Order Class-D Amplifiers," and is hereby incorporated herein by reference in its entirety.

BACKGROUND

A Class-D amplifier is a type of amplifier that is well-suited for certain applications—in particular, audio applications. Many class-D amplifiers include higher-order loop filters with multiple integrators.

SUMMARY

In some examples, an amplifier comprises a first integrator to receive a differential input signal, a second integrator coupled to the first integrator, a third integrator coupled to the second integrator, and a comparator to receive outputs of the second and third integrators, to compare each of the outputs to a reference signal that is below a power supply rail voltage supplied to the amplifier, and to produce an error current based on the comparison. The amplifier also comprises a feedback connection between the comparator and inputs to the second integrator. The feedback connection injects the inputs to the second integrator with a current that is determined at least in part by the error current.

In some examples, a class-D amplifier comprises an integrator chain comprising a plurality of integrators, each of the integrators having multiple inputs and multiple outputs; a summer having inputs coupled to the outputs of a subset of the plurality of integrators; a first comparator having inputs coupled to the outputs of the subset of the plurality of integrators and to a first reference signal input; and a second comparator having inputs coupled to outputs of the summer and to a second reference signal input. The outputs of the first and second comparators couple to inputs of one of the plurality of integrators.

In some examples, a method comprises operating a class-D amplifier with a loop filter having an integrator chain comprising a plurality of integrators and providing outputs of each of a subset of the plurality of integrators to a first comparator and to a summer. The first comparator receives a first reference signal. The method also comprises providing outputs of the summer to a second comparator, where the second comparator receives a second reference signal. The method further comprises injecting an error current into an input of a first of the subset of the plurality of integrators based on outputs of the first and second comparators.

BRIEF DESCRIPTION OF THE DRAWINGS

For a detailed description of various examples, reference will now be made to the accompanying drawings in which.

DETAILED DESCRIPTION

Figure 1:
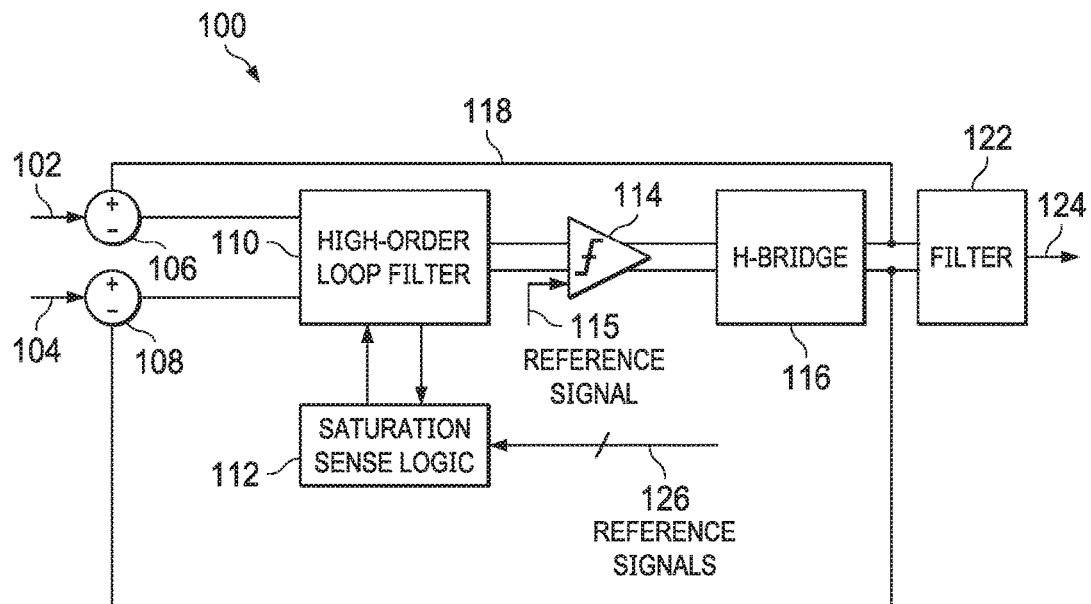
FIG. 1 is a block diagram depicting an illustrative amplifier in accordance with various examples.

Many class-D amplifiers include higher-order loop filters with multiple integrators and a summer to sum the outputs of the integrators, thereby producing a final voltage signal that is subsequently modulated by the Class-D loop. Most audio Class-D amplifiers are designed to support input signals that are just below full-scale power (i.e., input amplitude) and up to approximately 20 kHz in frequency. However, when input signals are at full power and/or at ultrasonic frequencies, the loop performance degrades. More specifically, one or more of the integrators may enter saturation, and the amplifier may have difficulty escaping saturation even after the high-power or high-frequency input signal is removed. Traditionally, this problem has been addressed by including a sense loop at or near the output of the summer. The sense loop compares the signal at the output of the summer to a threshold and, if the threshold is exceeded, the sense loop injects an error current into the output of the first integrator. For this technique to be successful, however, the loop filter should be designed such that the summer output crosses the desired threshold and indicates saturation when each of the non-zero cross saturation integrators (i.e., the integrator(s) in the integrator chain of the loop filter that does not saturate as a result of its differential outputs being equal) also saturate. Such a requirement necessitates designing the loop in such a way that excess power and area are consumed, making it an undesirable solution. In addition, while this technique may be somewhat effective for detecting when the entire integrator chain is in saturation, it does not address the situation where only one or a subset of the integrators in the integrator chain of the higher-order loop filter are in saturation. Stated another way, in some cases, one or more of the integrators in the integrator chain may be saturated while the summer outputs do not indicate saturation. In such instances, the sense loop does not take action to correct the problem and bring the integrator(s) out of saturation. This situation may lead to amplifier instability and performance degradation.

This disclosure describes a class-D amplifier architecture that solves the foregoing problem by implementing multiple sense loops—for example, two sense loops. A first sense loop compares an output(s) of the integrator chain summer in the higher-order loop filter with a threshold and, in response to the threshold being exceeded, the architecture is configured to produce an error current. In addition, the architecture described herein provides a second sense loop that compares output signals from one or more of the integrators to a different threshold. In response to this different threshold being exceeded, the architecture is configured to produce a different error current. The amplifier architecture combines the two error currents to produce a single error current that is then injected into the output of the first integrator. In this way, the architecture accounts not only for the situation in which the output of the summer indicates saturation of the loop, but also the situation in which one or more individual integrators in the chain are saturated. Thus, this architecture enables a fast response to individual integrators entering saturation and pulls the loop out of saturation quickly and smoothly, thereby promoting amplifier stability and mitigating performance degradation while avoiding the need for designs that consume excessive amounts of space and power.

FIG. 1 is a block diagram depicting an illustrative amplifier 100 in accordance with various examples. The amplifier 100, in some examples, is a class-D amplifier. In some examples, the amplifier 100 includes differential inputs 102 and 104; combination blocks 106 and 108 to combine the inputs 102, 104 with feedback signals 118, 120, respectively; a loop filter (e.g., a high-order loop filter) 110 coupled to a saturation sense logic 112; a comparator 114; an H-bridge 116; and a low-pass filter 122. The filter 122 produces an output 124.

The loop filter 110 comprises an integrator chain (depicted in and described with respect to FIG. 2) having N integrators, where N is two or greater, and it further includes a summer (also depicted in and described with respect to FIG. 2) to combine the outputs of one or more of the integrators in the integrator chain. In some examples, the output of the loop filter 110 to the saturation sense logic 112 includes outputs of one or more of the integrators in the integrator chain. In some examples, the output of the loop filter 110 to the saturation sense logic 112 additionally includes an output of the summer. The saturation sense logic 112 receives one or more reference signals 126. In some examples, the saturation sense logic 112 compares the outputs of the one or more integrators in the integrator chain to one of the reference signals 126. In response to one or more of the integrator outputs exceeding a corresponding reference signal 126, the saturation sense logic 112 produces an error current that it injects into the integrator chain of the loop filter 110 (e.g., in an output of the first integrator or input of the second integrator in the chain). In some examples, the error current is proportional to the degree by which the one or more integrator outputs provided to the saturation sense logic 112 exceeds the reference signal 126.

In some examples, the saturation sense logic 112 additionally compares the outputs of the summer to another one of the reference signals 126. In response to one or more of the summer outputs exceeding the corresponding reference signal 126, the saturation sense logic 112 produces an error current that it injects into the integrator chain of the loop filter 110 (e.g., in an output of the first integrator or input of the second integrator in the chain). In some examples, the error current is proportional to the degree by which the one or more summer outputs provided to the saturation sense logic 112 exceeds the corresponding reference signal 126. In some examples, this error current is combined with the error current produced by comparing the integrator outputs to the corresponding reference signal 126 to produce a single error current that is injected into the loop filter 110 (e.g., into the output of the first integrator or the input to the second integrator in the chain). The remainder of the components in the amplifier 100 include the comparator 114, the H-bridge 116, the filter 122, the feedback signals 118, 120, the output signal 124, the combination blocks 106, 108, and the inputs 102, 104, but the operation of these is not directly material to the multiple sense loop technique described herein and thus is not described in detail.

Figure 2:
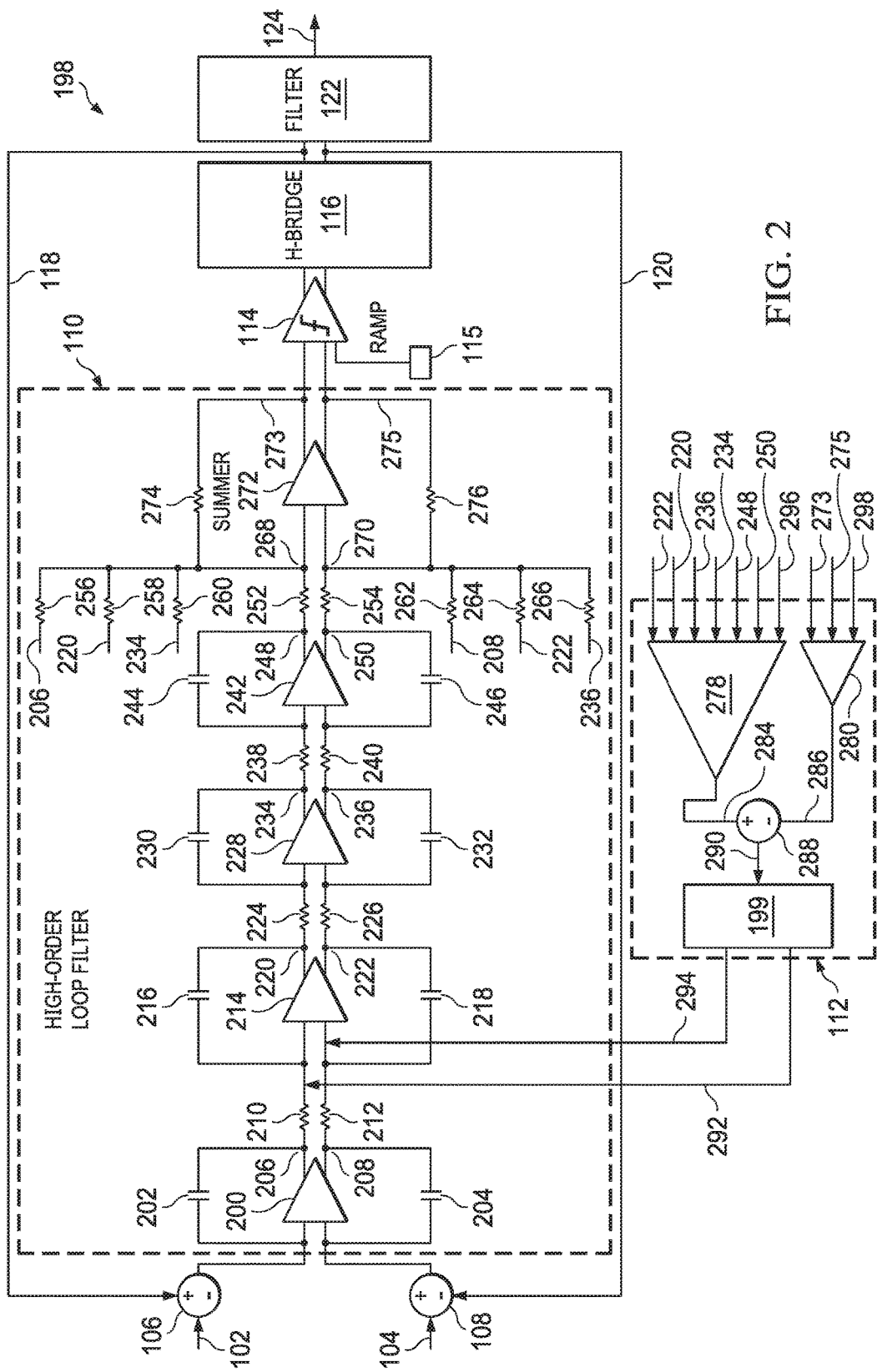
FIG. 2 is a circuit schematic diagram depicting an illustrative amplifier in accordance with various examples.

FIG. 2 is a circuit schematic diagram depicting an illustrative class-D amplifier 198 in accordance with various examples. The amplifier 198 is numbered differently than the amplifier 100 of FIG. 1 because the amplifier 198 is an illustrative example of the amplifier 100. The amplifier 100 is not limited to the specific circuitry of the amplifier 198 as depicted in FIG. 2.

In some examples, the amplifier 198 includes at least some of the same or similar components as the amplifier 100. These components are not again described here. The loop filter 110 of the amplifier 198, in some examples, includes integrators 200, 214, 228, and 242. Together, these integrators form an integrator chain, with the integrator 200 considered the first integrator and the integrator 242 considered the fourth or last integrator. Although four integrators are shown, any suitable number of integrators is usable and falls within the scope of this disclosure. The integrator 200 couples to the outputs of the combination blocks 106 and 108 and receives them as inputs (e.g., as a differential input signal). The integrator 200 produces outputs at nodes 206 and 208. The nodes 206 and 208 couple via feedback loops to the inputs of the integrator 200, as shown. The feedback loop coupling to the node 206 includes a capacitor 202, and the feedback loop coupling to the node 208 includes a capacitor 204. The output nodes 206 and 208 couple to resistors 210 and 212, respectively.

The inputs to the integrator 214 couple to the resistors 210 and 212. The outputs of the integrator 214 are provided at output nodes 220 and 222, which couple to capacitors 216 and 218, respectively, and which also couple to resistors 224 and 226, respectively. The inputs to the integrator 228 couple to the resistors 224 and 226. The outputs of the integrator 228 are provided at output nodes 234 and 236, which couple to capacitors 230 and 232, respectively, and which also couple to resistors 238 and 240, respectively. The inputs to the integrator 242 couple to the resistors 238 and 240. The outputs of the integrator 242 are provided at output nodes 248 and 250, which couple to capacitors 244 and 246, respectively, and which also couple to resistors 252 and 254, respectively.

The loop filter 110 additionally includes a summer 272. The summer 272 includes input nodes 268 and 270, which form a differential input. (As shown in FIG. 2, in some examples, differential inputs and outputs are used throughout the amplifier 198, although the scope of this disclosure is not limited as such.) The input node 268 couples to the resistor 252. In addition, the input node 268 couples to resistors 256, 258, and 260, which couple to nodes 206, 220, and 234, respectively. The input node 270 couples to the resistor 254. In addition, the input node 270 couples to resistors 262, 264, and 266, which couple to nodes 208, 222, and 236, respectively. The summer 272 receives the combined currents at input nodes 268 and 270 to produce summer output voltages at outputs 273 and 275. Output 273 couples to the node 268 via resistor 274. Output 275 couples to the node 270 via resistor 276. As explained above with respect to the amplifier 100, various components of the amplifier 198 are not directly material to the operation of the filter 110 and the saturation sense logic 112. The comparator 114, however, receives a reference signal (e.g., a ramp reference signal) 115, which, in some examples, is used to determine one of the reference signals provided to the saturation sense logic 112, as described below.

Still referring to FIG. 2, in some examples, the saturation sense logic 112 comprises balanced comparators 278 and 280. Each of the comparators 278 and 280 is configured to receive multiple inputs and a reference signal and to produce an output that is proportional to the degree by which one or more of the inputs exceeds the reference signal. In some examples, for instance, the comparator 278 receives the voltage signals present at nodes 222, 220, 236, 234, 248, and 250. (Stated another way, in some examples, the comparator 278 receives as inputs the signals output by integrators that do not saturate during zero cross, i.e., when the reference signal 115 is compared with a relatively low differential summer output voltage (e.g., less than 1 V, depending on the application). In some examples, this includes the integrator chain with the exception of the first integrator 200, as shown in FIG. 2. The comparator 278 additionally receives a reference signal 296, which, in some examples, is one of the reference signals 126 of FIG. 1 and is selected to be slightly below the positive power supply rail voltage supplying the amplifier 100 (e.g., 90% of the power supply rail voltage). The comparator 278 compares the reference signal 296 against the remaining input signals. If one or more of the input signals exceeds reference signal 296, the comparator generates an output signal 284 proportional to the degree by which the corresponding signal(s) exceeds the reference signal 296. Similarly, in some examples, the comparator 280 receives the voltage signals present at nodes 273 and 275—that is, the outputs of the summer 272. The comparator 280 additionally receives a reference signal 298, which, in some examples, is one of the reference signals 126 of FIG. 1 and is selected to be just above the peak of the ramp reference signal 115 (e.g., 102% of the peak ramp reference signal voltage). The comparator 280 compares the reference signal 298 against the remaining input signals. The degree by which the remaining input signals exceed the reference signal 298 is used to generate an output signal 286. The output signals 284 and 286 are error currents. In some examples, a combination block 288 combines the error currents 284 and 286 to produce an error current 290. In some examples, the error current 290 is injected into the integrator chain, e.g., at the inputs to integrator 214. Because in some examples the amplifier 198 is a differential system, the saturation sense logic 112 uses a current mirror 199 (or an equivalent circuit) to generate differential currents 292 and 294, which are injected into the inputs of the integrator 214 as shown. In some examples, the error current 290 that is sufficient to bring the loop out of saturation is given by:

$$\frac{AVDD - VCM2}{R2}$$

where AVDD is the difference between the upper and lower supply rails of the integrator 200, VCM2 is the common mode voltage of the integrator 214, and R2 is the resistance of either resistor 210 or 212 at the outputs of the first integrator 200, with the resistances of resistors 210, 212, in some examples, being equal.

In some examples, the saturation sense logic 112 includes at least two sense loops: one including comparator 278, and one including comparator 280. By using separate sense loops in this manner, saturation can be detected by individual comparators and adjustments can be made, even if the summer 272 output indicates no saturation, despite other integrators in the loop remaining saturated. In some examples, the error current outputs of the comparators 278, 280 can counteract each other. This can lead to a situation in which the amplifier 198 or integrators in the amplifier 198 are "stuck" in saturation due to equal and opposite error current values. To avoid this scenario, one of the two comparators 278, 280 is weighted more heavily than the other such that when they receive inputs that are the same relative to their corresponding reference signals, the weighted comparator (e.g., comparator 280) provides a higher error current than the other comparator. This weighting may be achieved, for example, by increasing the current supplied to the weighted comparator relative to the current supplied to the non-weighted comparator.

Figure 3:
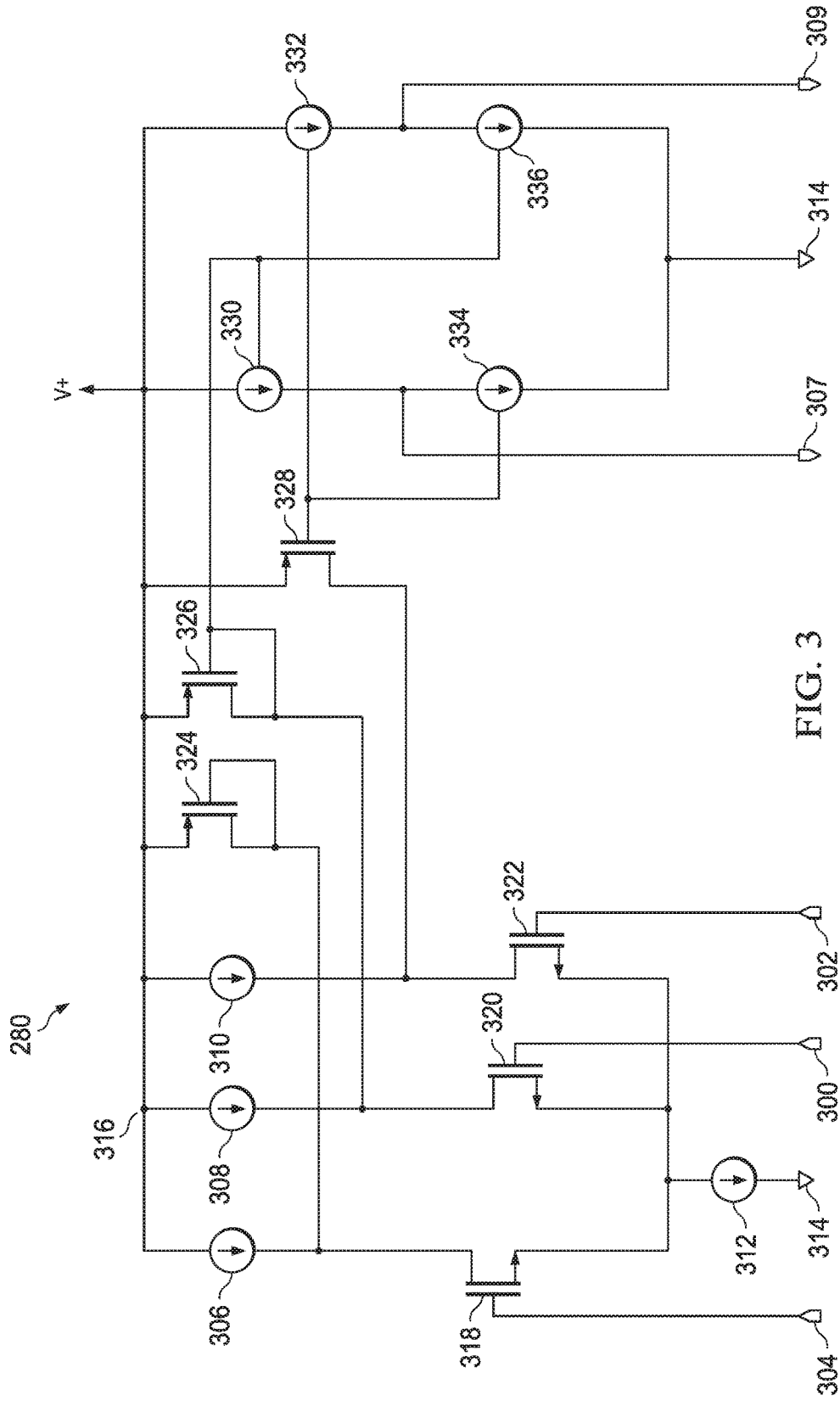
FIG. 3 is a circuit schematic diagram depicting an illustrative comparator in accordance with various examples.

FIG. 3 is a circuit schematic diagram depicting an illustrative comparator 280 in accordance with various examples. The comparator 278 may be designed in a manner similar to the comparator 280, although neither comparator is limited to the circuit specifically depicted in FIG. 3. The example depicted in FIG. 3 includes input terminals 300, 302, and 304. The input terminals 300 and 302 couple to outputs 273, 275 of the summer 272 (or to outputs of one or more integrators), as described above. The input terminal 304 couples to a reference signal, such as the reference signal 298 (FIG. 2). The comparator 280 includes output terminals 307, 309, which represent a differential version of the error current 286 (FIG. 2). The comparator 280 further includes tail current supplies 306, 308, 310, and 312. In some examples (e.g., where transistors 318, 320, and 322, described below, are identically sized), the current provided by current supply 306 is approximately (i.e., plus or minus 10%) half of the current provided by current supply 312 and the currents provided by current supplies 308 and 310 are approximately equal to the current provided by current supply 312. Current supply 312 couples to ground 314 and the current supplies 306, 308, and 310 couple to a positive power supply rail 316. The comparator 280 further comprises transistors (e.g., metal oxide semiconductor field effect transistors (MOSFETs) or bipolar junction transistors (BJTs)) 318, 320, 322, 324, 326, and 328. In some examples, a source of the transistor 318 couples to the current supply 312. In some examples, a drain of the transistor 318 couples to the current supply 306 and to a drain of the transistor 324. In some examples, a gate of the transistor 318 couples to the input terminal 304. In some examples, a gate of the transistor 324 couples to a drain of the transistor 324.

In some examples, input terminal 300 couples to the gate of transistor 320. In some examples, a source of the transistor 320 couples to the current supply 312. In some examples, a drain of the transistor 320 couples to a drain of the transistor 326. In some examples, a drain of the transistor 326 couples to a gate of the transistor 326. In some examples, input terminal 302 couples to the gate of the transistor 322. In some examples, a source of the transistor 322 couples to the current supply 312. In some examples, a drain of the transistor 322 couples to a drain of the transistor 328. In some examples, the sources of the transistors 324, 326, and 328 couple to the positive power supply rail 316, as do the current supplies 306, 308, and 310.

In some examples, the comparator 280 includes current supplies 330, 332, 334, and 336. Current supplies 330, 332 couple to the positive power supply rail 316, and current supplies 334, 336 couple to ground 314. Current supplies 330, 336 are set to provide a fraction of the current provided by the transistor 326. Current supplies 332, 334 are set to provide a fraction of the current provided by the transistor 328. At a given time, the outputs on output terminals 307, 309 are provided either by the pair of current supplies 330, 336 or the pair of current supplies 332, 334. The output terminals 307 and 309 carry a differential error current that is proportional to the degree by which the input signals at terminals 300, 302 exceed the reference signal at terminal 304. Specifically, and for example when transistors 318, 320, and 322 are equally sized, if either of the inputs at terminals 300, 302 exceeds the reference signal at terminal 304, the corresponding transistor begins to carry a current and the corresponding currents provided by current supplies 330, 332, 334, 336 begin to be adjusted in accordance with this current. For example, if the signal at input terminal 300 exceeds the signal at input terminal 304, the transistor 326 begins to conduct, which causes the corresponding current supplies 330, 336 to adjust the differential error current provided at output terminals 307, 309 accordingly. For equally sized transistors 318, 320, and 322, when the signal at input terminal 300 or 302 is equal to the reference signal at input terminal 304, the corresponding transistor 320 or 322 and the transistor 318 conduct equally. In addition, the corresponding transistor 324 or 326 carries a zero error current, since current supplies 308 and 310 provide half the current provided by current supply 312. As the signal at the relevant input terminal 300, 302 exceeds the reference signal applied at the input terminal 304, the current in the aforementioned transistors increases, thus causing the differential error to increase across supplies 330, 336 or 332, 334. In this way, the balanced comparator 280 provides a smooth recovery from saturation when the sense loops become active.

Figure 4:
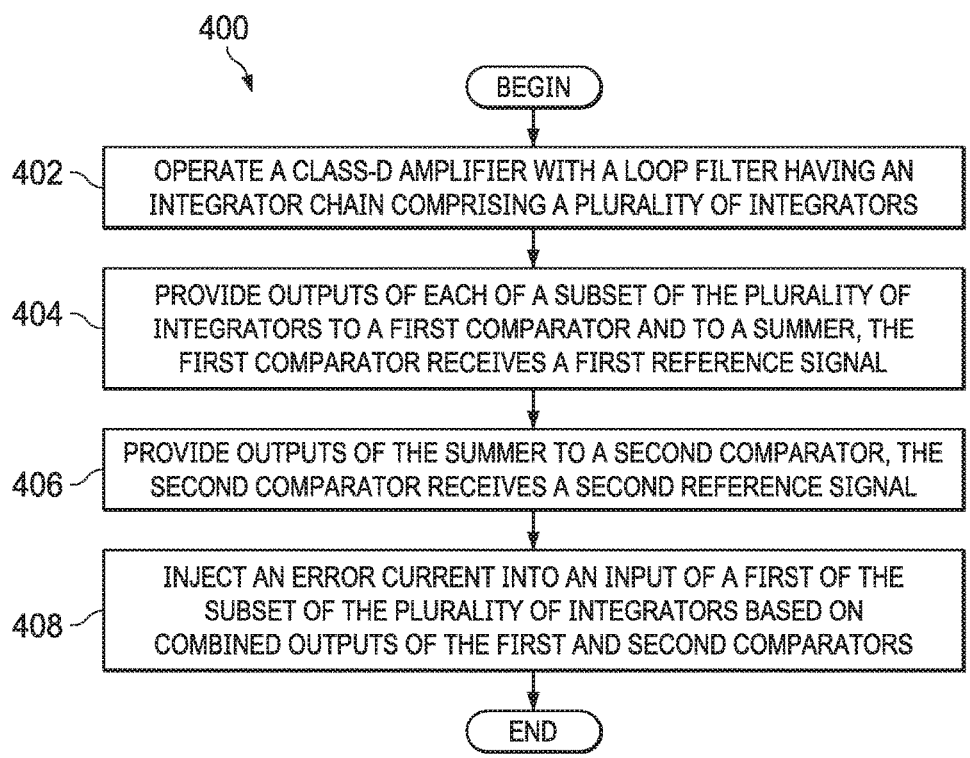
FIG. 4 is a flow diagram depicting an illustrative method in accordance with various examples.

FIG. 4 is a flow diagram depicting an illustrative method 400 in accordance with various examples. The method 400 begins by operating a class-D amplifier with a higher-order loop filter (step 402). The filter comprises an integrator chain having a plurality of integrators. The method 400 next includes providing outputs of each of a subset of the plurality of integrators to a first comparator and to a summer, where the first comparator receives a first reference signal (step 404). In some examples, this subset of integrators is limited to the non-zero cross saturation integrators described above. The method 400 includes providing outputs of the summer to a second comparator, where the second comparator receives a second reference signal (step 406). The method additionally comprises injecting an error current into an input of a first of the subset of the plurality of integrators based on the summed outputs of the first and second comparators (step 408). The method 400 may be modified as desired, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An amplifier, comprising:
a first integrator to receive a differential input signal;
a second integrator coupled to the first integrator;
a third integrator coupled to the second integrator;
a comparator to receive outputs of the second and third integrators, to compare each of the outputs to a reference signal that is below a power supply rail voltage supplied to the amplifier, and to produce an error current based on the comparison; and
a feedback connection between the comparator and inputs to the second integrator, wherein the feedback connection injects the inputs to the second integrator with a current that is determined at least in part by the error current.

2. The amplifier of claim 1 further comprising:
a summer to produce a differential output voltage indicating a sum of outputs of the second and third integrators; and
a second comparator to receive the differential output voltage and a second reference signal and to output a second error current.

3. The amplifier of claim 2, further comprising a combination block to combine the error current and the second error current to produce the current.

4. The amplifier of claim 3, wherein the second comparator is supplied with more current than the comparator.

5. The amplifier of claim 2, wherein the second reference signal is greater than a peak voltage of a ramp reference signal provided to another comparator coupled between the summer and an H-bridge in the amplifier.

6. The amplifier of claim 1, wherein the error current is proportional to a degree by which the outputs of the second and third integrators exceed the reference signal.

7. A class-D amplifier comprising:
an integrator chain comprising a plurality of integrators, each of the integrators having multiple inputs and multiple outputs;
a summer having inputs coupled to the outputs of a subset of the plurality of integrators;
a first comparator having inputs coupled to the outputs of the subset of the plurality of integrators and to a first reference signal input; and
a second comparator having inputs coupled to outputs of the summer and to a second reference signal input,
wherein outputs of the first and second comparators couple to inputs of a first subset of the plurality of integrators.

8. The amplifier of claim 7, wherein the subset of the plurality of integrators excludes a first integrator in the integrator chain.

9. The amplifier of claim 7, wherein the outputs of the first and second comparators couple to inputs of the second integrator in the integrator chain.

10. The amplifier of claim 7, wherein the output of the second comparator is more heavily weighted than the output of the first comparator.

11. The amplifier of claim 7, wherein the first reference signal is no greater than 90% of a power supply rail supplying the amplifier.

12. The amplifier of claim 7, wherein the second reference signal is greater than a peak voltage of a ramp reference signal provided to a third comparator coupled between the summer and an H-bridge in the amplifier.

13. The amplifier of claim 7, wherein error currents provided on the outputs of the first and second comparators are combined into a single error current signal.

14. The amplifier of claim 7, wherein the first comparator is configured to output an error signal that is proportional to the extent by which a signal input to the first comparator exceeds the first reference signal.

15. A method comprising:
operating a class-D amplifier with a loop filter having an integrator chain comprising a plurality of integrators;
providing outputs of each of a subset of the plurality of integrators to a first comparator and to a summer, the first comparator receives a first reference signal;
providing outputs of the summer to a second comparator, the second comparator receives a second reference signal; and
injecting an error current into an input of a first of the subset of the plurality of integrators based on outputs of the first and second comparators.

16. The method of claim 15, wherein the first reference signal is less than a power supply rail powering the class-D amplifier.

17. The method of claim 15, wherein the second reference signal is greater than a peak level of a ramp reference signal provided to a comparator coupled between the summer and an H-bridge in the class-D amplifier.

18. The method of claim 15 further comprising applying a greater weight to an output of the second comparator than to an output of the first comparator.

19. The method of claim 15 further comprising combining the outputs of the first and second comparators to produce the error current, wherein the error current comprises a differential signal.

20. The method of claim 15, wherein the subset of the plurality of integrators excludes a first integrator in the integrator chain.

* * * * *